United States Patent [19]
Christopher et al.

[11] 4,203,134
[45] May 13, 1980

[54] FM SIGNAL DEMODULATOR WITH DEFECT DETECTION

[75] Inventors: Todd J. Christopher, Indianapolis, Ind.; Tsan H. Lin, Millsboro, Del.

[73] Assignee: RCA Corporation, New York, N.Y.

[21] Appl. No.: 948,013

[22] Filed: Oct. 2, 1978

[51] Int. Cl.² .......................... H04N 5/76; H04N 5/78
[52] U.S. Cl. ..................... 358/128.5; 358/8; 360/38
[58] Field of Search .......... 358/127, 128, 8; 360/38

[56] References Cited

U.S. PATENT DOCUMENTS

| | | | |
|---|---|---|---|
| 3,967,311 | 1/1976 | Fuhrer | 358/128 |
| 3,969,759 | 7/1976 | Amery | 358/128 |
| 4,000,511 | 12/1976 | Kenney | 358/128 |
| 4,001,496 | 1/1977 | Clemens et al. | 358/128 |
| 4,017,892 | 4/1977 | Takahara et al. | 358/128 |
| 4,038,686 | 7/1977 | Baker | 358/128 |

*Primary Examiner*—Daryl W. Cook
*Attorney, Agent, or Firm*—E. M. Whitacre; J. S. Tripoli

[57] ABSTRACT

In the playback of a video disc record employing an FM carrier recording format, a defect compensation system is provided which substitutes delayed video signals for current video signals when a defect is encountered. A phase locked loop including a phase detector and a voltage controlled oscillator is employed in FM detection circuits. A defect detector compares the phase between the oscillator output signal and a signal corresponding to the recovered signal. When the phase difference between these two signals exceeds a certain value, a defect signal is generated to disable the normal signal path of the recovered signal so that the delayed version of the video may be substituted for the current video for the duration of the occurrence of the defect.

8 Claims, 18 Drawing Figures

FM SIGNAL DEMODULATOR WITH DEFECT DETECTION

The present invention relates to defect detection apparatus suitable for use in the playback of a video record employing an FM carrier recording format.

In U.S. Pat. No. 3,842,194, issued to Jon K. Clemens on Oct. 15, 1974 a video disc recording/playback system is disclosed in which recorded information appears in the form of geometric variations in the bottom of a spiral groove in the surface of a disc substrate covered by a conductive coating, with a dielectric layer overlying the conductive coating. A playback stylus, including a conductive electrode affixed to an insulating support, is received in the record groove. The stylus electrode cooperates with the disc coatings to form a capacitance which varies, as the disc is rotated, in accordance with the groove bottom geometry variations passing beneath the stylus electrode. Appropriate circuitry, coupled to the stylus electrode, translates the capacitive variations to electrical signal variations representative of the recorded information.

In a desirable form of the above-described capacitance video disc system, the recorded information comprises a carrier frequency modulated in accordance with video signals and appears in the form of successive groove bottom depth alternations between maximum and minimum depths. In the use of this FM carrier recording format, FM detector apparatus must be employed in the player to obtain video signals from the recovered FM signal.

As illustrated in U.S. Pat. No. 4,038,686, issued to Alfred L. Baker on July 26, 1977 the FM detector in the player may comprise a zero-crossing detector and a monostable multivibrator responsive thereto for providing an output pulse of a standard width and amplitude in response to each zero-crossing of the input signal. The output pulses are applied to a low-pass filter having a passband substantially matching the recorded video signal bandwidth to develop the desired video signals.

In operation of a video disc player of the above-described type to recover recorded video signals for image display purposes, a problem observable in the displayed picture (in the absence of suitable compensation) is the intermittent appearance in random locations of disturbances in the form of white and/or black spots and streaks supplanting the appropriate picture information. These picture defects may vary in length, thickness and persistence of appearance. While not destructive of the picture information as a whole, the intermittent appearance of such picture defects can be a source of considerable annoyance to the viewer. The present invention is concerned with apparatus for detecting the onset of such picture defects so that apparatus for substantially eliminating or significantly reducing the annoying effects of such picture defects can be activated.

As explained in U.S. Pat. No. 4,001,496 issued to Jon K. Clemens, et al., on Jan. 4, 1977, a variety of different causes may lead to the production of different ones of the annoying picture spots and streaks. Some of the causes may be associated with defects in the record itself, which may originate in various stages associated with the record production. Other causes may be associated with the condition encountered in a particular playing of a given disc: e.g., due to stylus encounters with debris of various forms in various regions of the disc groove, which may be subject to change with successive plays of a disc. Other causes may be associated with the past history of use or abuse of the disc being played, and involve mechanical alterations of the disc surface: e.g., scratches, chips or dents; or alterations of the disc surface, due for example, to the effects of fingerprints on the disc. Thus, there are myriad causes of differing types which result in the defect problem having a high degree of unpredictability, and varying from disc to disc, play to play, groove region to groove region, etc.

In the aforementioned Clemens, et al. patent it is recognized that the defects are manifested as spurious alterations of the repetition rate of zero crossings (e.g., introducing extra zero crossings, or missing zero crossings) in the recovered signal. The result of extra zero crossings or missing zero crossings appears as an abrupt change in frequency toward and usually beyond one of the deviation range frequency limits associated with the recorded signal. This appears in the video output signal of the FM detector filter as a shift to an extreme white or black level. Moreover, due to the limited frequency response of the filter, the spurious shift (and subsequent return to normal) is stretched in time relative to the actual duration of the spurious condition in the input FM signal. Additionally, ringing effects associated with reactive elements of the filter are likely to persist in disturbing the output video signal for at least a short period following termination of the spurious input signal condition.

The aforesaid Clemens, et al. patent employs an approach to defect detection which is based upon several well-grounded premises: (1) that the instantaneous carrier frequency of the FM signal input to the player's FM detector is shifted by desired signal information only within known, fixed limits (i.e., as determined by the deviation range employed in recording), wherefore shifts to frequencies beyond such limits are due not to desired signal information but to spurious, defective signal development or delivery conditions; (2) that essentially all of the noticeable, troublesome picture defects of the type here discussed stem from input signal defects that shift the apparent instantaneous carrier frequency well beyond the known deviation range limits.

In the approach of the Clemens, et al. patent a first means coupled to the player's FM demodulator develops an output impulse when the instantaneous frequency of the recovered signal exceeds a first threshold frequency beyond the upper limit of the intended deviation range; additional means coupled to the FM demodulator develops an output impulse when the instantaneous frequency of the recovered signal falls below a second threshold frequency beneath the lower limit of the intended deviation range. The respective output impulses are summed in an adder to form a defect indication signal, providing an indication of the intervals occupied by those input signal defects that engender the troublesome picture defects previously discussed. The defect indication signal is used to control switching of the player from a normal operating mode to a defect compensation mode. In the latter mode, a delayed signal constituting information from a preceding image line is used, in substitution for the current video signal output of the FM detector, to develop the player output signal. Because of the general redundancy of information in successive image lines, the preceding line information substitution serves to mask the defect occurrence, rendering it relatively unnoticeable to the image viewer.

However, because of the limited bandwidth of the video signal output filter of the player's FM demodulator, the termination of the signal disturbance in the output of the latter filter may be expected to lag the termination of the associated input signal defect. In recognition of this lag effect, there is associated with the player mode switching apparatus of the aforesaid Clemens, et al. patent suitable means for effectively "stretching" the effect of the defect indication pulses so as to maintain the substitution mode until the current signal output of the FM detector filter is substantially free of the disturbances that cause defective image display.

As disclosed in the Clemens et al. patent, a technique for the identification of input signal frequency departures from the above-mentioned threshold frequency boundaries relies upon comparison of the instantaneous level of a video signal developed from an output of the player's FM detector with maximum and minimum levels closely related to the instantaneous video signal levels that are produced by that FM detector in response to input signal frequencies at the deviation range limits. The input to the level comparators is not the normally filtered video signal output of the FM detector used for image display purposes, but rather is an output developed by a defect detector input filter in the form of a low pass filter having a cutoff frequency well above the highest recorded video signal frequency. For accuracy of the level comparison, the input to the level comparators appropriately includes the DC component of the recovered video signal.

A rise in the voltage level at the output of the defect detector input filter to a level above a high level comparator threshold, initiates a defect indication pulse in the comparator output; in a representative FM format wherein video signal excursions in the "white" direction cause an increase in carrier frequency, this comparator output is indicative of the onset of a "white" defect in the displayed image. A similar development of a "black" defect indication pulse is provided by a low level comparator in response to a shift to the defect detector filter output level below the low level comparator threshold. The wideband response of the defect detector input filter aids in the provision of an early indication of the onset of the defect by the level comparators.

In the above-described forms of defect detectors, reliance is placed on the analysis of zero crossings in the FM detector as the basis for determining when and if there has been an occasion of a defect occurrence. Basically these prior forms of defect detector comprised either pulse discriminators with two channels, one for determining the occurrence of too long an interval between pulses, corresponding to a black defect, and the other channel for determining the occurrence of too short an interval between pulses, corresponding to a white defect (as in the Baker patent), or a single pulse counter with a separate averaging filter and two voltage threshold comparators, as in the Clemens patent. Although quite useful, these defect detectors are complex in structure in that two timing channels or an additional filter and threshold comparators must be constructed. In addition, these detectors are difficult to produce in integrated circuit form with the type of precision desired for the application involved.

In accordance with the present invention, a system is described for detecting defects in the recovered FM signal, that is, detecting occasions when the instantaneous frequency (or equivalently, the time rate of change in phase) of the recovered signal departs from the expected frequency deviation range, which is easily and desirably constructed in integrated circuit form, yet rapidly senses those instances where it is desirable to initiate compensation measures.

More specifically, in accordance with the present invention, apparatus is described for use in a signal translating system having a source of carrier waves, the instantaneous frequency of which is subject to variation over a given deviation range of frequencies, and which is subject to occasions of defective operation when the apparent instantaneous frequency of the carrier waves departs from the given range. A phase locked loop, having a phase detector and a voltage controlled oscillator is provided. The phase detector responds to signals corresponding to the carrier waves and to the output signals of the oscillator to provide an output signal which depends upon the phase relationship of the signals supplied thereto. The oscillator input control signal is derived from the phase detector output signal and the oscillator output frequency is thereby altered in a direction to maintain the relative phase between the input signals supplied to the phase detector within a certain range of values. The parameters of phase locked loop are adjusted so that the loop will accurately track the expected range of frequency excursions of the carrier waves. The output signals from the oscillator and the signals corresponding to the carrier waves are provided at a defect detection means which provides a defect indication signal when the relative phase between the signals applied thereto departs from a given range of values (the departure corresponding to the occasion of a defect) and which provides a reference level signal when the relative phase between the signals applied thereto is within the given range of values.

In further accordance with the principles of the present invention, the output signal from the phase detector is provided at a system low pass filter for developing a signal, related to the carrier waves, which is in turn provided to a utilization means. Means are then provided for disabling the signal path between the system low pass filter and the utilization means in response to the defect indication signal.

FIGS. 3(a) to 3(h) are waveforms illustrating the operation of the defect detector of FIG. 2 when the incoming frequency falls below a given range; and FIGS. 4(a) to 4(h) are waveforms illustrating the operation of the defect detector of FIG. 2 when the incoming frequency rises above a given range.

Figure 1:
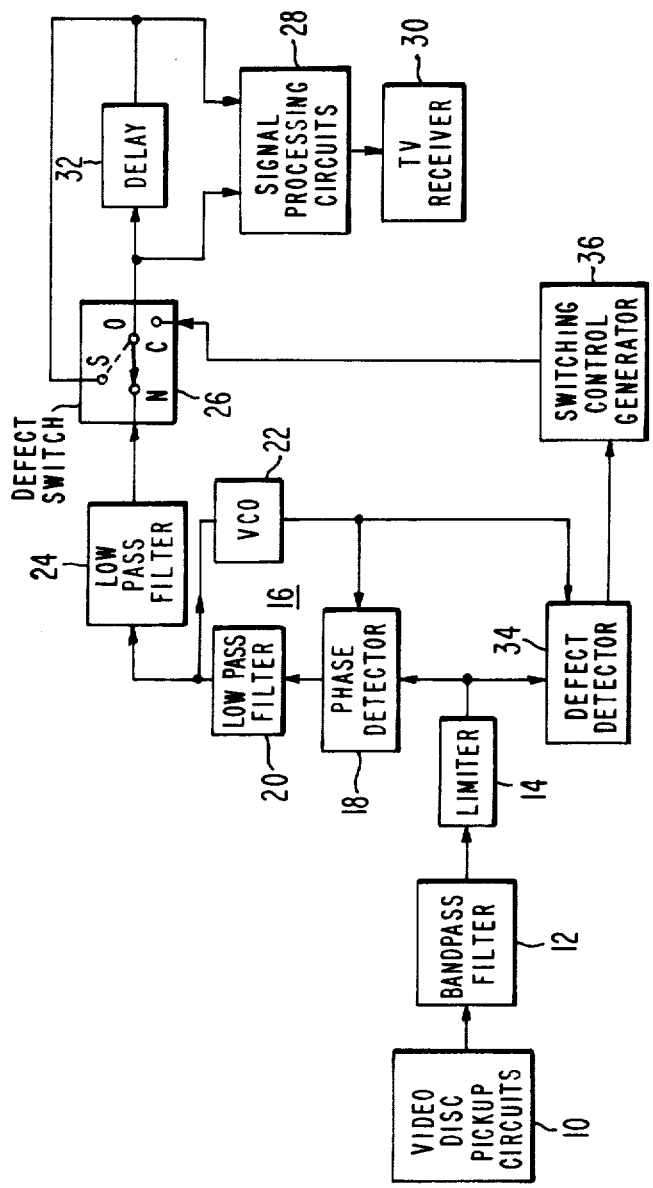
FIG. 1 is a block diagram representation of a portion of the circuitry of a video disc player incorporating a defect detection system embodying principles of the present invention.

In the video disc player apparatus of FIG. 1, a recorded signal is recovered during playback of a video disc by video disc pickup circuits 10. Illustratively, the video disc pickup system is of the capacitance type previously described, and the structure and circuit arrangement of the video disc pickup circuitry may be, for example, as described in U.S. Pat. No. 3,872,240, issued to D. J. Carlson, et al. on Mar. 18, 1975. The recording format of the disc subject to playback is such that the recovered signal information includes a frequency modulated picture carrier, the instantaneous carrier frequency deviating within fixed deviation range limits (e.g., 3.9–6.9 MHz) in accordance with the amplitude of a composite video signal occupying a band of frequencies (e.g., 0–3 MHz) below the deviation range, and representative of a succession of color images to be displayed.

A bandpass filter 12, having a pass band encompassing the picture carrier deviation range and appropriate sidebands thereof, selectively passes the frequency modulated picture carrier signal to a limiter 14 (serving the conventional purpose of removing or reducing spurious amplitude modulation of the input FM signal). The limiter output is applied to a phase locked loop 16 comprising a phase detector 18, a loop low pass filter 20 and a voltage controlled oscillator 22.

Phase detector 18 compares the phase of the signal supplied by limiter 14 with the phase of the signal supplied by oscillator 22 to provide an output signal to the loop filter 20. The output signal of the phase detector is supplied to the voltage controlled oscillator 22 via loop filter 20 and is used to alter the frequency of the oscillator in a direction to maintain the phase difference of the signals applied to phase detector 18 within a certain range of values, i.e., within a stable operating condition.

As will be explained in greater detail herein, the output signal from oscillator 22 is initially set to be 90 degrees out of phase relative to the signal from limiter 14. The arrangement of phase locked loop 16 is such that the loop will be stable, that is, locked up, when the phase difference between the signals applied to the phase detector is within a range of plus or minus 90 degrees of the initial setting for a total stable range from 0 to 180 degrees when the initial phase difference is set at 90 degrees. When the phase difference falls within the range of values from 180 to 360 degrees, the loop is out of lock and the signal supplied to the oscillator causes the oscillator frequency to change until it returns to the range of values between 0 and 180 degrees of phase difference.

The signals from loop filter 20 are supplied to a system low pass filter 24. The passband of filter 24 substantially matches the band (e.g., 0–3 MHz) occupied by the recorded video signal information.

The circuits comprising limiter 14, phase locked loop 16 and low pass filter 24 form an FM demodulator or detector providing a signal at an output terminal of filter 24 in the form of a composite video signal corresponding to the modulation of the input FM signal. Illustratively, the video signal information recovered from the disc may comprise a composite color video signal encoded in a "buried subcarrier" format, as disclosed in U.S. Pat. No. 3,872,498, issued on Mar. 18, 1975 to Dalton H. Pritchard.

The signal provided by filter 24 is supplied to the "normal signal" input terminal N of electronic defect switch 26. Switch 26 serves the purpose of alternatively: (1) coupling the signal appearing at the signal input terminal N to switch 26 output terminal O; or (2) coupling the signal appearing at a "substitution" terminal S to the switch output terminal O. Switching between the respective "normal" and "substitution" states is effected by control signals supplied to a control signal input terminal C from apparatus to be subsequently described.

Under normal operating conditions, switch 26 couples the video signals appearing at terminal N to output terminal O for delivery to signal processing circuits 28, where the video signals are processed to a form suitable for application to a television receiver 30.

Television receiver 30 serves to display a succession of images representative of the recorded signal information. However, as previously discussed, at randomly occurring intervals during the playback of a disc record, defects may appear in the input FM signal which will affect the video signal appearing at terminal N of switch 26 in a manner which would cause the aforementioned black/white streak and spot type defects in the displayed image on receiver 30 if the receiver 30 remains responsive to the signals at terminal N. To avoid such picture defect display, the player of FIG. 1 incorporates a defect detection apparatus in accordance with the principles of the present invention and a defect compensation apparatus. The compensation approach involves the use of: (1) a delayed version of the signals at terminal O, via delay element 32, for delivery to terminal S of switch 26; (2) a defect detector 34, which will be described in greater detail herein, serving to develop a defect indication signal when the given deviation range of the recovered carrier waves is exceeded; and (3) a switch control generator 36, responsive to the defect indication signal to develop a switch control signal for application to terminal C of switch 26 to control the switching state of switch 26. Details of a useful switching control generator for the embodiment of FIG. 1 may be found in U.S. Pat. No. 3,909,518 issued to Alfred L. Baker on Sept. 30, 1975.

Typically, delay element 32 may comprise a CCD delay line or a glass delay line providing a signal delay corresponding to a period at the line scanning frequency of the video signal display system. The substituted delayed signal is delivered to terminal O of switch 26 for the duration of a defect as indicated by the signal delivered to terminal C of switch 26. When the occurrence of the defect is over the signal at terminal C causes output terminal O to be electrically connected to terminal N of switch 26 whereby normal operation is resumed.

Defect detector 34 is responsive to the signals from limiter 14 and to the signals from voltage controlled oscillator 22. Detector 34 analyzes the phase relationship between the signals applied thereto. Initially, the phase difference between the applied input signals is set at 90 degrees. Detector 34 is such that a fixed reference level signal is supplied to generator 36 when the phase difference between the applied signals is within plus or minus 90 degrees of the initial phase relationship. That is, there is a range from 0 degrees to 180 degrees of phase difference between the signals applied to detector 34 over which detector 34 will put out a reference level signal (e.g., 5 volts).

When the phase difference of the signals supplied to detector 34 falls outside of the stable range, that is, when the phase difference falls in the range of 180 to 360 degrees, the detector 34 puts out a defect indication signal in the form of a pulse which extends over a time duration covering the time from when the detected phase difference first exceeded the stable range until the time when the detected phase difference returned to the stable range.

It will be seen that the defect indication pulse occurs under specified phase relationships between a signal related to the recovered carrier waves and a voltage controlled oscillator signal. The signal from limiter 14 causes the phase difference to go out of the stable range when there is a significant rapid departure from the given deviation range of the FM carrier. The low pass loop filter 20 is such that it causes a certain degree of inertia in the loop response. Thus, although the oscillator is generally being controlled to track the limiter signal, the tracking will take place at a rate slower than the changes occurring in the limiter output signal due to defects.

The bandwidth of system low pass filter 24 is such that this filter imparts a delay to the signal passing through filter 24. Typically, filter 24 will cause a 200 to 400 n sec delay. This delay is sufficient for the detection of a defect in 34, the generation of a switch control signal in 36 and, the switching from the normal state to the substitution state in switch 26 all before the signal defect reaches the N terminal of switch 26.

Thus, the arrangement shown in FIG. 1 forms an FM detector with signal defect detection and demonstrates a compensation mode upon the detection of an occurrence of a signal defect. The arrangement is such that a defect pulse is generated when at least one cycle is added or deleted when looking at the phase relationship of the signals supplied to detector 34. In the zero crossing type FM detectors mentioned previously, a defect would be indicated when a single crossover pulse was out of position.

In the present invention the oscillator 22 will stay in lock as long as the phase difference between the limiter 14 output signal and the oscillator output signal is within plus or minus 90 degrees of the initial 90 degree value. If the phase detector 18 senses a phase difference beyond plus 90 degrees from the initial 90 degree difference, the oscillator will move to a new stable condition very likely by adding at least one cycle. If the sensed phase difference goes below minus 90 degrees from the initial 90 degree difference, the oscillator will very likely slip at least one whole cycle to return to a stable range of phase difference values. This gain or loss of a cycle is considered a defect and the defect detector 34 determines when a cycle has been added or dropped and provides a defect indication pulse in the event of such an occurrence.

Figure 2:
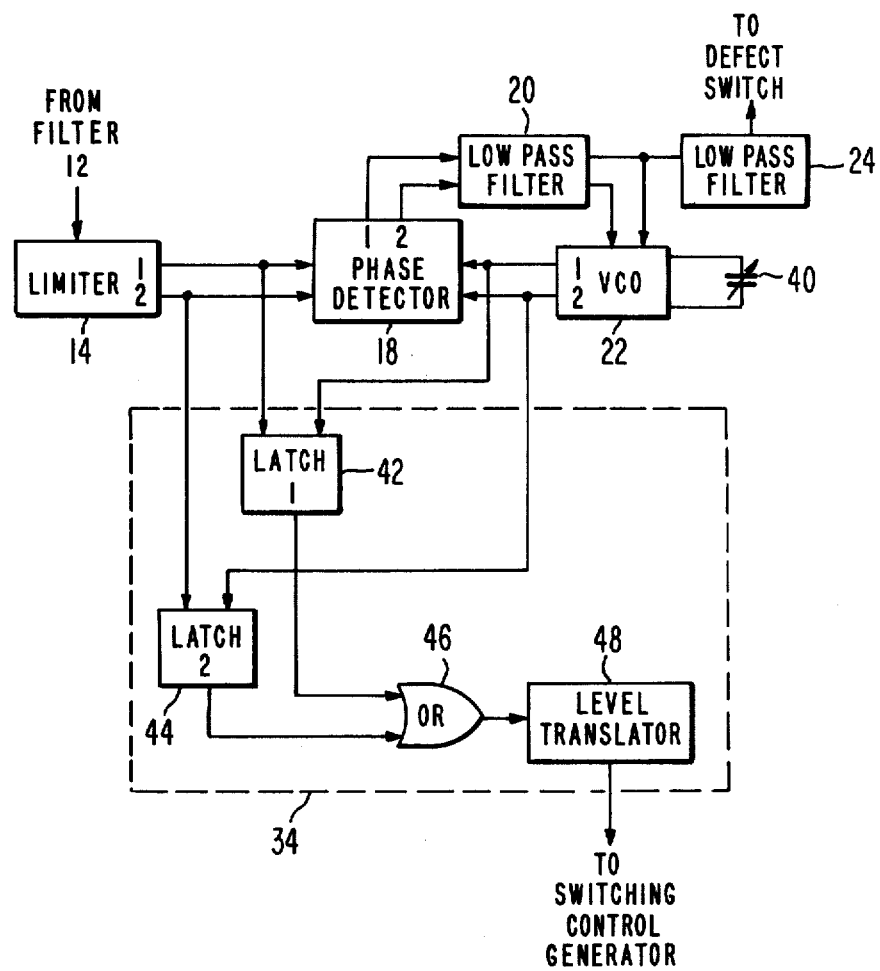
FIG. 2 is a block diagram representation of the phase locked loop and defect detector described in respect of FIG. 1.

In FIG. 2, elements previously referred to have the same numerical designations in the description which follows. In the specific embodiment of FIG. 2, limiter 14 is arranged to limit the amplitude excursions of the FM signal provided at the input thereof to a degree such that output signals are generated which are substantially pulse train signals having pulse widths related to the frequency of the incoming signal. As the incoming FM signal goes down in frequency, the limiter output signal pulse width increases. As the FM signal goes up in frequency, the limiter output signal pulse width is decreased. Thus, the desired deviation range on the FM signal can be translated into a range of pulse widths at the limiter output.

In the embodiment shown in FIG. 2, limiter 14 is arranged to provide two complementary output pulse signals in response to the applied FM signal. The form of limiter output signal 2 is identical to limiter output signal 1 except that signal 2 is 180 degrees out of phase with respect to signal 1. This feature is illustrated in FIGS. 3(b) and 3(e) and again in FIGS. 4(b) and 4(e).

Similarly, VCO 22 is arranged to provide a first and a second output pulse signal wherein the two signals are identical except for a 180 degree phase difference. VCO 22 has a variable capacitor 40 coupled thereto which is used to set an initial operating frequency for the oscillator which sets the initial phase difference at 90°. Typical oscillator output waveforms are shown in FIGS. 3(a) and 3(d) and again in FIGS. 4(a) and 4(d).

The first and second output signals from limiter 14 and the first and second oscillator output signals are coupled to phase detector 18. Phase detector 18 operates upon the signals provided thereto in the manner of an exclusive NOR circuit. That is, phase detector 18 compares, for example, the VCO 1 signal with the limiter 1 signal and provides a high output when the applied signals are the same, i.e., both high or both low, and provides a low output signal when the applied signals are different, i.e., one high, the other low. A second phase detector signal 180 degrees out of phase with the first is also provided. The phase detector output signal resulting from the comparison of the VCO 1 signal with the limiter 1 signal is shown in FIGS. 3(c) and 4(c). The output signal from phase detector 18 is coupled to low pass filter 20 (the phase locked loop filter). Filter 20 has a relatively broad pass band, e.g., 0–6 MHz, as compared to the pass band of the detector system filter, e.g., 0–3 MHz. The output signals from filter 20 are coupled to VCO 22 and to system filter 24. The output signals from system filter 24, which now represent the detected FM signal containing information previously recorded on the video disc are provided to the defect switch 26 for further processing.

VCO 22 responds to signals provided from the loop filter 20 in a manner which causes the output frequency of the oscillator signals to track the frequency excursions of the input signals. As a result of the influence of the loop filter 20, the tracking takes place at a relatively slow rate as compared to the frequency of the limiter output signals. In order not to complicate the waveform diagrams, the VCO signals are shown as a relatively constant frequency signal in FIGS. 3 and 4.

Initially, the first and second output signals of the VCO are set up to be, respectively, 90 degrees out of phase with the first and second limiter output signals. This is shown in FIGS. 3(a) and 3(b) and in FIGS. 4(a) and 4(b).

The VCO 1 signal and the limiter 1 signal are coupled to a first latch circuit 42 in defect detector 34. Similarly, the VCO 2 signal and the limiter 2 signal are coupled to a second latch circuit 44. Latch circuits 42 and 44 comprise devices which will sample the level of the applied limiter signal on positive going transitions of the VCO signal and then holds that level until the next sample is taken at the next positive going transition of the VCO signal. Latch circuits 42 and 44 may typically comprise D-type flip-flops which are generally referred to as latching flip-flops. The output signal provided by latch circuit 42 is shown in FIGS. 3(f) and 4(f) and the output signal from latch 44 is shown in FIGS. 3(g) and 4(g).

The output signals from latch circuits 42 and 44 are combined in OR gate 46. Gate 46 operates such that when either or both of the applied input signals are high a high output level is provided. When both input signals are at a low level, the output signal is at a low level. Typical output signal waveforms for gate 46 are shown in FIGS. 3(h) and 4(h). The gate 46 output signal is then coupled to a level translator 48 where the voltage level of the pulse is adjusted for compatibility with the switching control generator 36.

Figure 3:
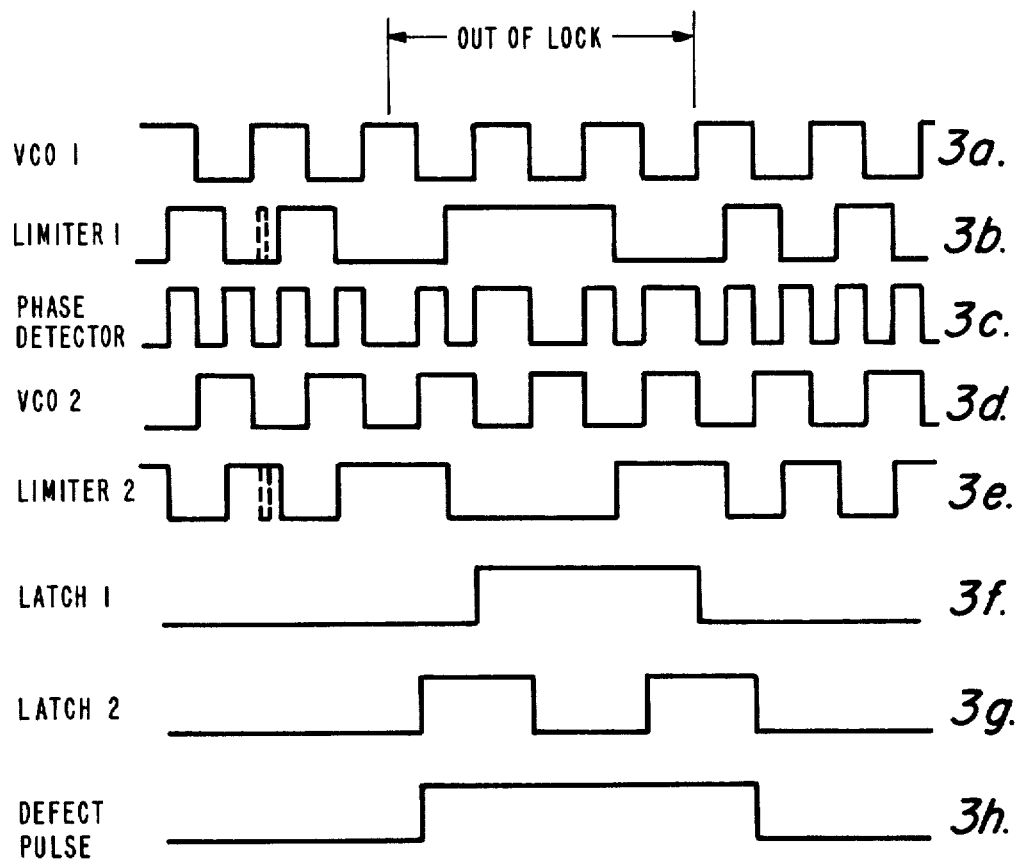

Referring now to FIG. 3, it will be seen that a condition is shown wherein the limiter 1 signal frequency has fallen to a value which is outside of the desired frequency deviation range and the limiter 1 signal contains fewer pulses than expected within the deviation range.

Again, the VCO signals 1 and 2 are shown as constant frequency signals even during the out of lock condition, i.e., where the phase detector 18 no longer provides the 50 percent duty cycle signal to the VCO 22. Depending upon system parameters, the VCO 22 will start to hunt at some point in time after the beginning of an out of lock condition.

The latch 1 signal of FIG. 3(f) is developed by sampling the limiter 1 signal on positive transitions of the VCO 1 signal and then holding the sampled level until the next positive transition of the VCO signal. Because the sampling in latch 42 takes place once per VCO cycle, the out of lock condition is not immediately sensed by latch 42. In the example shown, the first positive transition of the VCO 1 signal comes 270 degrees after the out of lock condition began.

Latch 44 is used to sample the limiter 2 signal on the positive transitions of the VCO 2 signal. In the example shown in FIG. 3, the first response shown in the latch 2 signal comes at about 90 degrees after the start of the out of lock condition. Since the two VCO signals are 180 degrees out of phase with respect to each other, and since the VCO signals 1 and 2 are respectively initially out of phase with the limiter 1 and 2 signals by 90 degrees, there is a range of relative phase values between the VCO signal and the limiter signal of plus and minus 90 degrees from the initial 90 degree value, or a range of 180 degrees within which the latch circuits will not provide an output. That is, with respect to departures beyond the low end of the desired frequency deviation range there is a range of relative phase values between the VCO signal and the limiter signal which comprises a stable state and no defect pulse initiation occurs.

When the out of lock condition passes, i.e., the incoming FM signal is within the desired deviation range, the positive transition sample at latch 42 causes the latch 1 signal to go to a low level (see FIGS. 3(a), 3(b) and 3(f)), but, the positive sample at latch 44 comes 180 degrees later to return the latch 2 signal to a low level (see FIGS. 3(d), 3(e) and 3(g)).

The defect signal, shown in FIG. 3(h), covers the time period from the first high latch signal to the last latch signal to go low. Thus, the defect signal is not necessarily coincident with the out of lock condition. The defect pulse may be further operated upon in the switching control generator using pulse stretching techniques so that the delayed signal substitution may be initiated prior to the time the defect appears at the input terminal of the defect switch 26 and extended to terminate at a time when all remnants of the defect have died out.

Figure 4:
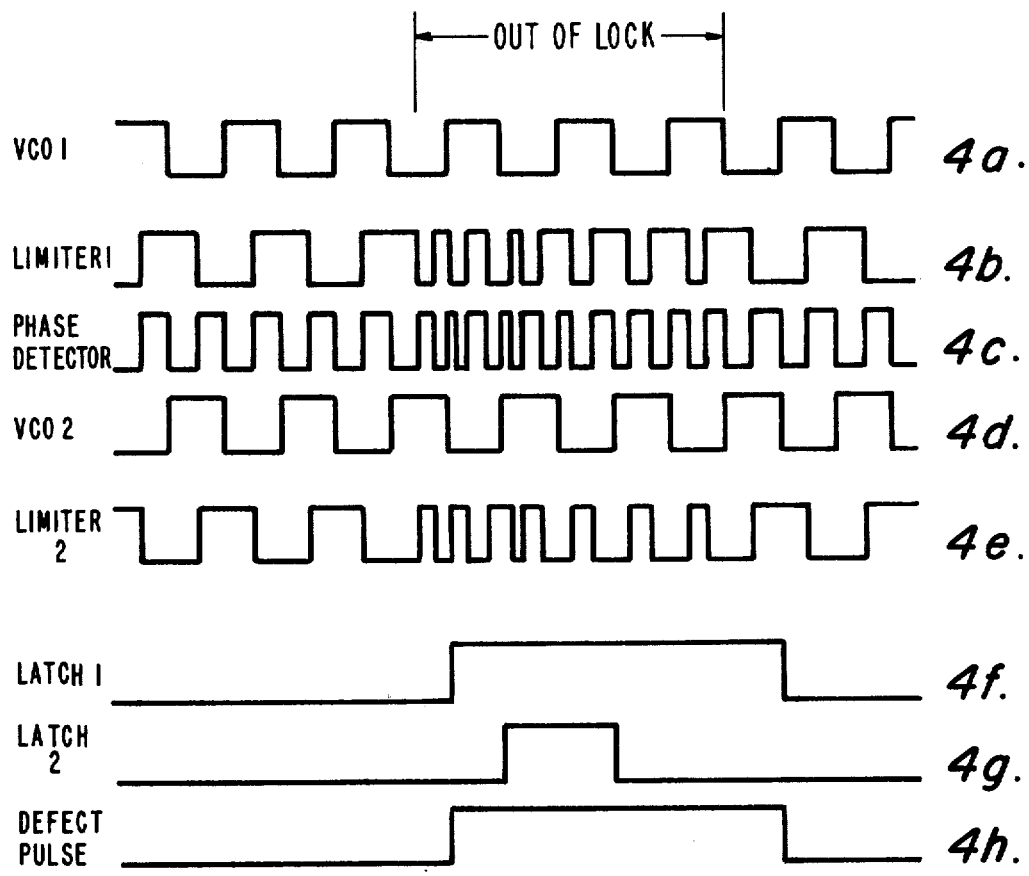

FIG. 4 shows the waveform patterns for the FM demodulator and defect detector when the recovered signal includes frequencies which rise above the desired deviation range. Under these conditions the limiter 1 output signal shows more pulses than would be expected when operating within the desired deviation range.

Again, the VCO signals are not shown as changing during the out of lock condition for purposes of clarity. But, it should be understood that at some point in time the VCO will typically change its frequency under command of the phase detector signal until the original 90 degree phase relationship between the VCO output signal and the corresponding limiter output signal is restored.

Latch circuits 42 and 44 function as previously described to generate the signals shown in FIGS. 4(f) and 4(g) respectively. These signals are combined in OR gate 46 to provide the defect indication pulse shown in FIG. 4(b).

The overall result of the operation of the system described above is such that when the frequency of the input signal is either too high or too low, i.e., outside of the desired deviation range, such that the phase locked loop 16 drops out of lock, the phase relationship between the VCO output signal (e.g., output signal 1) and the input signal (e.g., limiter signal 1) falls outside of the 0 to 180 degree range. When the phase difference between these two signals falls between 180 and 360 degrees the sampling function of the latch circuits (e.g., circuit 42) provides a signal indicating that the incoming signal contains a defect and compensation, by substitution, should be made.

The system described herein may advantageously be constructed in integrated circuit form and is especially suitable for integration in form of an emitter-coupled-logic device. In fact, the limiter 14, phase detector 18, VCO 22 and defect detector 34 may all be integrated on the same circuit chip to thereby provide an efficient and economical FM demodulator with defect detection.

What is claimed is:

1. In a signal translating system including a source of carrier waves, the instantaneous frequency of said carrier waves being subject to variation over a given deviation range, said source being randomly subject to occasions of defective operation during which the apparent instantaneous frequency of said carrier waves departs from said given deviation range, the apparatus comprising:

a phase locked loop having a phase detector and a voltage controlled oscillator, said phase detector being responsive to first signals corresponding to said carrier waves and to the output signals of said oscillator for providing output signals dependent upon the phase relationship between the signals applied thereto, said oscillator being responsive to said phase detector output signals for altering the frequency of the oscillator output signals in a direction to maintain the relative phase between said first signals and said oscillator output signals within a certain range of values; and defect detection means responsive to said first signals and to said oscillator output signals for providing a defect indication signal when the relative phase between said first signals and said oscillator output signals departs from a given range of values, said departure corresponding to an occurrence of said occasions of defective operation, and for providing a reference level signal when the relative phase between said first signals and said oscillator output signals is within said given range of values.

2. The apparatus according to claim 1, wherein said certain range of values is within the limits of 0° to 180°.

3. The apparatus according to claim 2 wherein said given range of values is within the limits of 90° ± an angle equal to or less than 90°.

4. The apparatus according to claim 3 further comprising a limiter means responsive to said source of carrier waves for providing said first signals.

5. In a signal translating system including a source of carrier waves, the instantaneous frequency of said carrier waves being subject to variation over a given deviation range, said source being randomly subject to occasions of defective operation during which the apparent instantaneous frequency of said carrier waves departs from said given deviation range, the apparatus comprising:

- limiter means responsive to said source of carrier waves for providing first pulse signals corresponding to said carrier waves;
- a phase locked loop having a phase detector and a voltage controlled oscillator, said phase detector being responsive to said first pulse signals and to the output signals of said oscillator for providing output pulse signals dependent upon the phase relationship between the signals applied thereto, said oscillator being responsive to said phase detector output pulse signals for altering the frequency of the oscillator output signals in a direction to maintain the relative phase between said first pulse signals and said oscillator output signals within a certain range of values; and
- defect detection means responsive to said first pulse signals and to said oscillator output signals for providing a defect indication pulse signal when the relative phase between said first pulse signals and said oscillator output signals departs from a given range of values, said departure corresponding to an occurrence of said occasions of defective operation, and for providing a reference level signal when the relative phase between said first pulse signals and said oscillator output signals is within said given range of values;
- filter means responsive to signals corresponding to said phase detector output pulse signals for providing a second signal, corresponding to said first signal, to a utilization means; and
- means responsive to said defect indication signal for disabling the signal path between said filter means and said utilization means.

6. The apparatus according to claim 5 wherein said certain range of values is within the limits of 0° to 180°.

7. The apparatus according to claim 6 wherein said given range of values is within the limits of 90°± an angle less than or equal to 90°.

8. The apparatus according to claim 7 wherein said defect detection means comprises:
- first and second latch circuits for respectively providing first and second defect pulses, each of said latch circuits being responsive to said first pulse signals and to said oscillator output pulse signals; and
- summing means for summing said first and second defect pulses and for providing said defect indication pulse signal in response thereto.

* * * * *